United States Patent
Isobe et al.

(10) Patent No.: US 7,551,037 B2
(45) Date of Patent: Jun. 23, 2009

(54) PLL CIRCUIT HAVING REDUCED PULL-IN TIME

(75) Inventors: Masaya Isobe, Nara (JP); Albert O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 137 days.

(21) Appl. No.: 11/290,437

(22) Filed: Dec. 1, 2005

(65) Prior Publication Data

US 2006/0119440 A1  Jun. 8, 2006

(30) Foreign Application Priority Data

Dec. 2, 2004  (JP)  ............................... 2004-350472

(51) Int. Cl.
*H03L 7/08*  (2006.01)
(52) U.S. Cl. ............................ 331/16; 331/17; 327/157
(58) Field of Classification Search ................... 331/16, 331/17; 327/157
See application file for complete search history.

(56) References Cited

U.S. PATENT DOCUMENTS

| | | | |
|---|---|---|---|
| 5,477,194 A | | 12/1995 | Nagakura |
| 5,877,701 A | * | 3/1999 | Nagakura ................... 340/7.42 |
| 6,643,347 B2 | * | 11/2003 | Ohishi ......................... 375/376 |
| 6,724,265 B2 | * | 4/2004 | Humphreys ................... 331/17 |
| 6,867,655 B2 | * | 3/2005 | McCarthy ..................... 331/25 |
| 6,998,922 B2 | * | 2/2006 | Jensen et al. ................... 331/17 |
| 7,106,140 B2 | * | 9/2006 | Mone ............................ 331/16 |
| 2006/0055466 A1 | * | 3/2006 | Hirano et al. .................. 331/16 |

FOREIGN PATENT DOCUMENTS

| | | |
|---|---|---|
| JP | 7-030413 A | 1/1995 |
| JP | 08-125527 | 5/1996 |
| JP | 08-125527 A | 5/1996 |
| JP | 08-288843 A | 11/1996 |
| JP | 11-027143 A | 1/1999 |
| JP | 11-220390 | 8/1999 |
| JP | 11-308104 A | 11/1999 |
| JP | 2002-252561 | 9/2002 |
| JP | 2002-319861 A | 10/2002 |
| KR | 2002-88545 | 11/2002 |

* cited by examiner

*Primary Examiner*—Robert Pascal
*Assistant Examiner*—Levi Gannon
(74) *Attorney, Agent, or Firm*—Harness, Dickey & Pierce, P.L.C.

(57) ABSTRACT

The PLL circuit of the present invention includes a voltage-controlled oscillator, a loop filter, and a charge pump which controls a voltage of the loop filter while the voltage-controlled oscillator is not oscillating. Therefore, it is possible, even while the voltage-controlled oscillator is not oscillating, to control a voltage for the charge pump so that it is equal to a voltage when the voltage-controlled oscillator is oscillating at a predetermined frequency. Accordingly, by the loop filter outputting a voltage signal to the voltage-controlled oscillator when the PLL circuit is turned on, the pull-in time can be shortened.

10 Claims, 9 Drawing Sheets

PLL CIRCUIT HAVING REDUCED PULL-IN TIME

This nonprovisional application claims priority under 35 U.S.C. § 119(a) on Patent Application No. 2004-350472 filed in Japan on Dec. 2, 2004, the entire contents of which are hereby incorporated by reference.

FIELD OF THE INVENTION

The present invention relates to PLL circuits used for the purpose of increasing the speed of and reducing the power consumption of a system which frequently and repeatedly switches on/off, such as a wireless LAN system.

BACKGROUND OF THE INVENTION

Apparatus, such as mobile phones and wireless LAN systems, includes a PLL circuit so that the oscillator section can produce a high frequency signal. The PLL circuit and associated circuitry consume a lot of power. To reduce power consumption in such apparatus, the PLL circuit is activated only when necessary, for example, in transmission and reception. That is, the PLL circuit is frequently turned on/off. A conventional, popular approach to reduce power consumption in mobile phones, wireless LAN systems, and like apparatus is to power off the PLL circuit unless it is being used in transmission or reception ("standby period").

The PLL circuit however has a problem that it takes time to produce a stable frequency after the power supply is turned on. This is due to the structure of the PLL circuit. The PLL circuit contains a voltage-controlled oscillator (VCO) with a feedback loop. The oscillation control voltage fed back to the VCO is altered in such a manner to eliminate a phase difference between a reference signal and an oscillation signal, hence achieving a target oscillation frequency.

FIG. 9 shows how power consumption in the transceiver block of a conventional wireless LAN system changes with time when receiving a data packet. In the figure, the numbers, 901 to 904, indicate the power consumption levels of the transceiver block. 901 indicates a power consumption level when receiving a data packet; 902 when transmitting an ACK signal as a response to the reception of the data packet; and 903 and 904 when standing by with the power supply being kept on and turned off respectively. The transceiver block can save power consumption by an equivalent to the hatched area in the figure if the power supply is turned off during the standby period (as compared with the case where the power supply remains turned on).

Assuming a data transfer rate of 512 kbps and a packet cycle of 20 ms under the IEEE 802.11b standards, for example, the hatched area in FIG. 9 (i.e. standby period) lasts for about 18.7 ms, which means that the standby period accounts for about 94% of the entire packet cycle. Therefore, reducing power consumption by turning off the power supply to the transceiver block during the standby period has a great impact on reducing power consumption in the wireless LAN system. In addition, given a data transfer rate of 1.4 Mbps and a packet cycle of 8 ms, the standby period is about 6.5 ms, which means that the standby period accounts for about 81% of the entire packet cycle. As would be understood from these figures, the standby period decreases with an increase in the data transfer rate. Nevertheless, the standby period still accounts for a large portion of the entire packet cycle. Thus, turning off the power supply during the standby period is an effective way to reduce power consumption in the wireless LAN system.

To turn on the power supply to the wireless LAN system in the off state, the PLL circuit's frequency must become stable first. Put differently, the PLL circuit's frequency must be stable before the wireless LAN system starts receiving a signal. The pull-in time, required for the PLL circuit to produce a stable frequency, is typical about 1 to 10 ms. Therefore, the power supply to the wireless LAN system should be turned on about 1 to 10 ms before the wireless LAN system starts receiving a signal. This is indicated by a double-head arrow 905 in FIG. 9. Thus, the time in which the power supply to the wireless LAN system can be turned off between the reception of a data packet and the reception of a next data packet decreases by the pull-in time. The pull-in time is indicated by the double-head arrow 905 and required for the PLL circuit to stabilize the frequency.

As the data transfer rate increases, the standby period decreases as noted above, but the pull-in time remains unchanged. The pull-in time is required for the PLL circuit to stabilize the frequency. In short, as the data transfer rate increases, the pull-in time has an increasingly greater negative impact on the reduction of the PLL circuit power consumption. The pull-in time is required for the PLL circuit to stabilize the frequency. To lower the power consumption of the PLL circuit, it is essential to cut the pull-in time short. The pull-in time is required for the PLL circuit to stabilize the frequency.

FIG. 5 is a block diagram of a common, conventional PLL circuit. A voltage-controlled oscillator 501 of the PLL circuit shown in the figure oscillates at a particular frequency fo according to an voltage value input at an oscillation control voltage input terminal 502, to output an oscillating signal from a voltage-controlled oscillator output terminal 503. The oscillating output is fed to an internal circuit of the system via the buffer amplifier 504 and directly fed to a prescaler 505. The prescaler 505 divides frequency to output a frequency-divided signal from an output terminal 506 to a phase comparator 507.

The phase comparator 507 is supplied with both the frequency-divided signal and a reference signal from a reference oscillator 508 constructed of, for example, a quartz oscillator. The phase comparator 507 drives a charge pump 509 with a phase difference signal on the basis of a phase difference between the two input signals, that is, the frequency-divided signal and the reference signal. Between the charge pump 509 and the voltage-controlled oscillator 501 is located a loop filter 510. The filter 510, constructed of a lowpass filter, smoothes, and removes noise from, the output signal of the charge pump for an output to the voltage-controlled oscillator 501.

The conventional PLL circuit includes the abovementioned loop through which the oscillating output of the voltage-controlled oscillator 501 is fed back to the voltage-controlled oscillator 501 as shown in FIG. 5. The feedback is repeated until there is no phase difference between the frequency-divided signal from the prescaler 505 and the reference signal from the reference oscillator 508. The frequency of the PLL circuit thus becomes stable. Ultimately, the PLL circuit oscillates at a predetermined frequency.

In conventional technology, the "in operation" value of the oscillation control voltage when the oscillation of the PLL circuit is stable is stored. Immediately after the circuit is turned on, a voltage setting means is used to force the oscillation control voltage to the stored value.

Referring to FIG. 6 to FIG. 8, the following will describe conventional art which is proposed to reduce the pull-in time for the PLL circuit. For convenience, the components of the PLL circuits shown in FIG. 6 to FIG. 8 that have the same arrangement and function as those in FIG. 5 are indicated by the same reference numerals and description thereof is omitted.

As a first conventional example, FIG. 6 is a block diagram illustrating the structure of the PLL circuit disclosed in Japanese Unexamined Patent Publication 1-305724/1989 (Tokukaihei 1-305724; published Dec. 11, 1989; hereinafter, "patent document 1"). As shown in the figure, the PLL circuit disclosed in patent document 1 has a read-only memory (ROM) 612 to reduce the pull-in time. The read-only memory 612 contains a table of oscillation control voltage values versus oscillation frequencies of a voltage-controlled oscillator 501 in the PLL circuit. A digital/analog converter (D/A converter) 613 produces a voltage required by the voltage-controlled oscillator 501 so that the oscillator 501 can oscillate at a predetermined frequency. A capacitor 511 in a loop filter 510 is charged in advance (precharged) while the PLL circuit is being powered off. This allows the voltage-controlled oscillator 501 to oscillate at a frequency close to a desired frequency when the power supply is turned on. It is thus possible to shorten the time the PLL loop takes to achieve a stable frequency.

As a second conventional example, FIG. 7 is a block diagram illustrating the structure of the PLL circuit disclosed in Japanese Unexamined Patent Publication 8-125527/1996 (Tokukaihei 8-125527; published on May 17, 1996) (hereinafter, "patent document 2"). As shown in the figure, the PLL circuit disclosed in patent document 2 includes a loop switch 712 between the charge pump 509 and the loop filter 510. The loop switch 712 is intended to hold the electric charge accumulated in the capacitor 511 in the loop filter 510 after the PLL circuit is turned off, so as to maintain across the capacitor 511 the control voltage being applied while the PLL circuit was in operation. In this manner, in the second conventional example, when the PLL circuit is off, the loop switch 712 maintains the control voltage being applied while the PLL circuit was in operation. This allows the voltage-controlled oscillator 501 to oscillate immediately at a frequency close to a desired frequency when the power supply is powered on. It is thus possible to shorten the time the PLL loop in the PLL circuit takes to achieve a stable frequency.

As a third conventional example, FIG. 8 is a block diagram illustrating the structure of the PLL circuit disclosed in Japanese Unexamined Patent Publication 2002-252561 (Tokukai 2002-252561; published on Sep. 6, 2002) (hereinafter, "patent document 3"). As shown in the figure, the PLL circuit disclosed in patent document 3, furthering the concepts of patent document 2, includes an automatic voltage control device 813 which records in an analog manner a voltage value of the loop filter 510 being applied while the PLL circuit is in operation. The input of the automatic voltage control device 813 is connected the loop filter output section 502 via the switch 814. The output of the automatic voltage control device 813 is connected to the voltage-controlled oscillator 501. When the PLL circuit is powered on again in an OFF state, the device 813 outputs the voltage value recorded in the automatic voltage control device 813 so that the voltage-controlled oscillator 501 can oscillate immediately at a frequency close to a desired frequency. The PLL circuit disclosed in patent document 3 thus shortens the time the PLL loop takes to achieve a stable frequency.

The structures of these first to third conventional examples have the following problems.

The first conventional example provides a potential to the loop filter when the power supply is turned on or a channel is altered. The capacitor in the loop filter needs to be precharged again every time the power supply is turned on/off. The structure may present an obstacle to reduction of power consumption, especially if it is employed in a system whose power supply is frequently turned on/off.

The second conventional example controls the loop switch between the charge pump and the loop filter so that the capacitor in the loop filter can hold charge while the PLL circuit is being off. The capacitor is not charged while the PLL circuit is being off. Therefore, the loop filter voltage may drop through leak of electric charge from, for example, a varactor diode connected to the control terminal of the voltage-controlled oscillator. Consequently, when the PLL circuit is turned on next time, the output voltage of the loop filter is lower than the control voltage being applied while in operation. This causes a shift in the initial frequency when the PLL circuit is turned on. The pull-in time shorting effects are thus reduced.

The third conventional example requires that a current supply circuit made primarily of a voltage generator circuit be separately provided. This may lead to increase in IC chip size and power consumption.

SUMMARY OF THE INVENTION

The present invention, conceived in view of the aforementioned conventional problems, has an objective to realize a PLL circuit which with a simple structure increases the speed of and reducing the power consumption of a system which are frequently and repeatedly turned on/off, such as a wireless LAN system.

A PLL circuit in accordance with the present invention, to achieve the objective, is characterized in that it includes: a voltage-controlled oscillator for altering an oscillation frequency according to an oscillation control voltage signal; a prescaler for dividing the oscillation frequency provided by the voltage-controlled oscillator to output a frequency-divided signal; a reference signal oscillator for producing an oscillating reference signal; a phase comparator for detecting a phase difference between the frequency-divided signal and the reference signal to output a phase difference signal based on the detection; a charge pump for outputting current in accordance with the phase difference signal from the phase comparator; and a loop filter for smoothing the output current of the charge pump for output as the oscillation control voltage signal to the voltage-controlled oscillator, wherein the charge pump controls a voltage of the loop filter while the voltage-controlled oscillator is not oscillating.

According to the structure, it is possible, while the PLL circuit is powered off, that is, while the voltage-controlled oscillator is not oscillating, to maintain using the charge pump the voltage of the loop filter at an oscillation voltage applied while the PLL was in stable operation in which the PLL circuit was oscillating at a predetermined frequency. If the voltage of the loop filter varies from a predetermined oscillation voltage while the voltage-controlled oscillator is not oscillating, the charge pump in the PLL circuit of the present invention either supplies current to the loop filter or draws current from the loop filter to control the voltage of the loop filter. Accordingly, when the PLL circuit is powered on again (the voltage-controlled oscillator starts oscillation) while the PLL circuit is off (the voltage-controlled oscillator is not oscillating), the PLL circuit takes less to pull in (shorter pull-in time). The PLL circuit thus achieves increased speed and reduced power consumption.

The current fed from the charge pump to the loop filter while the voltage-controlled oscillator is not oscillating compensates for leak current from the loop filter and has a very small value. Little power is therefore consumed to charge the loop filter, hardly affecting the overall power consumption of the PLL circuit. An example of means for holding voltage of the loop filter is a capacitor.

In addition, the charge pump and the loop filter in the PLL circuit of the present invention are always in operation state. It is therefore possible to maintain the voltage of the loop filter at an oscillation voltage in a state where the voltage-controlled oscillator is oscillating. In this manner, the PLL circuit of the present invention controls the voltage of the loop filter while keeping the loop filter in operation. Therefore, there is no need to provide a loop switch which isolates the loop filter from the PLL circuit. Further, current is supplied to, or drawn from, the loop filter using the charge pump in the PLL circuit, without making any modifications to the charge pump. The PLL circuit of the present invention thus achieves increased speed and reduced power consumption without adding complexity to the circuit structure. In the present invention, the PLL circuit is depicted as being "on" when the voltage-controlled oscillator is oscillating, regardless of whether or not the PLL circuit is oscillating at a predetermined frequency.

The PLL circuit in accordance with the present invention is constructed so as to control the voltage of the loop filter with the charge pump while the voltage-controlled oscillator is not oscillating. Therefore, when used in a system which is frequently turned on/off, the PLL circuit operates with less pull-in time and achieves increased speed and reduced power consumption.

Another PLL circuit in accordance with the present invention, to achieve the objective, is characterized in that it includes: a voltage-controlled oscillator capable of altering an oscillation frequency thereof according to a control voltage value; a prescaler for frequency dividing an oscillation signal output from the voltage-controlled oscillator; a reference oscillator providing a reference frequency for the voltage-controlled oscillator; a phase comparator for detecting a phase difference between a frequency-divided signal from the prescaler and a signal from the reference oscillator to output a phase difference signal; a charge pump for producing a current in accordance with the phase difference signal from the phase comparator; a loop filter constructed of a lowpass filter including a first capacitor and a resistor, the lowpass filter smoothing the current output of the charge pump for output as the control voltage value to the voltage-controlled oscillator; a voltage value memory circuit for recording a voltage value of the loop filter; a comparator for comparing an output voltage of the loop filter to the voltage value recorded in the voltage value memory circuit so as to output a comparison signal; and a circuit for producing a current output control signal for the charge pump in accordance with the comparison signal from the comparator.

According to the features, it is possible, while the PLL circuit is powered off, to compare the output voltage of the loop filter to the voltage value recorded in the voltage value memory circuit, and if the voltage of the loop filter increases or decreases from the voltage value recorded in the voltage value memory circuit, discharge or charge the first capacitor in the loop filter with the charge pump, so that the output voltage of the loop filter is restored to the original voltage. Thus, when the PLL circuit is powered on, the loop filter can supply the voltage-controlled oscillator with a voltage as immediately before the power off. The pull-in time of the PLL circuit is therefore shortened.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

The following will describe an embodiment of the present invention with reference to FIG. 1 through FIG. 4.

Figure 1:
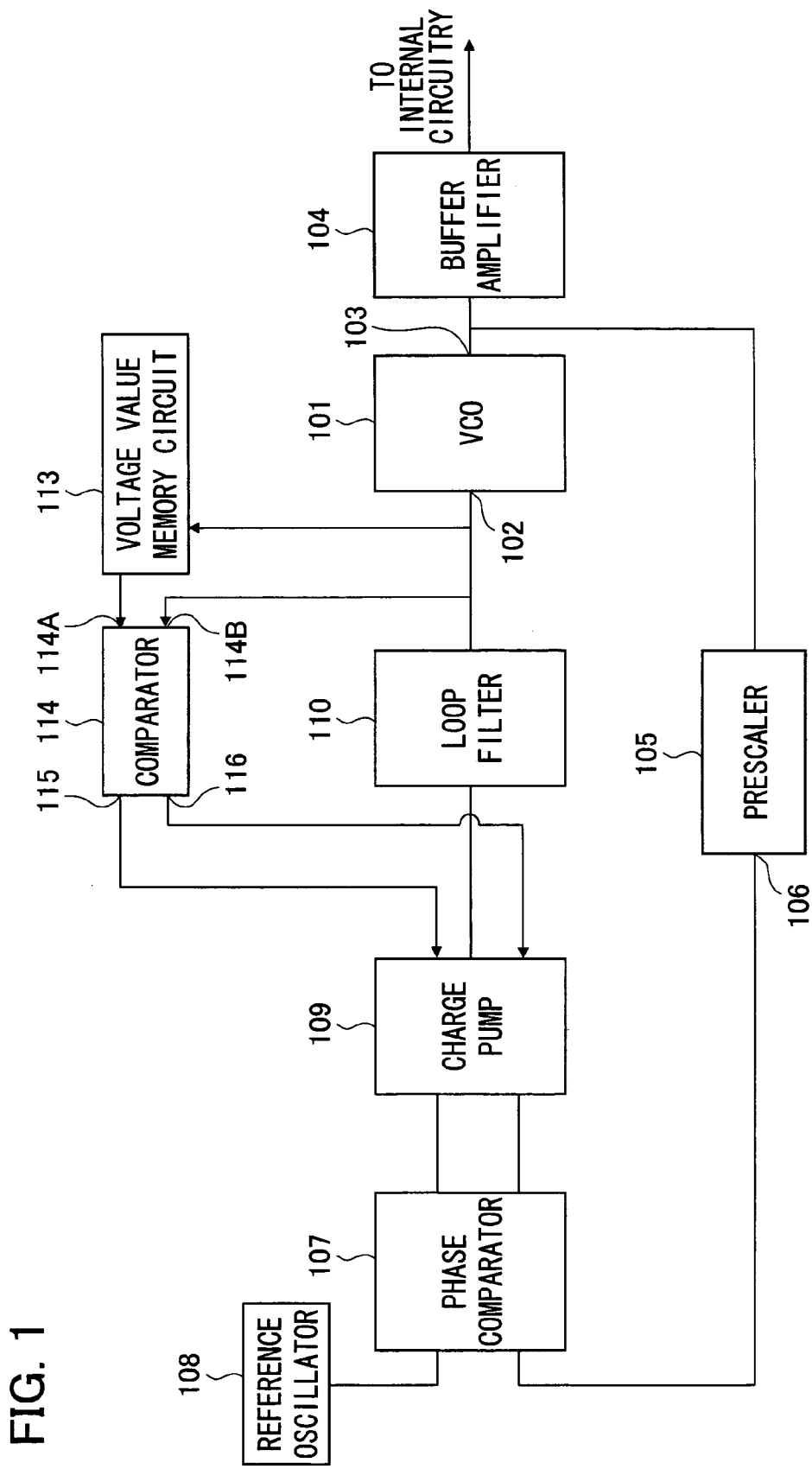
FIG. 1 is a block diagram illustrating the structure of a PLL circuit which represents an embodiment of the present invention.

FIG. 1 is a block diagram illustrating the structure of a PLL circuit which represents an embodiment of the present invention. As shown in the figure, the PLL circuit of the present embodiment includes a voltage-controlled oscillator 101, a buffer amplifier 104, a prescaler 105, a phase comparator 107, a reference oscillator (reference signal transmitter) 108, a charge pump 109, a loop filter 110, a voltage value memory circuit 113, and a comparator 114.

The voltage-controlled oscillator 101 includes an oscillation control voltage input terminal 102 and an output terminal 103. The oscillator 101 oscillates at a particular frequency fo according to an oscillation control voltage signal output of the loop filter 110 which is fed through the oscillation control voltage input terminal 102, so as to output an oscillating output from the output terminal 103. The oscillating output is fed to an internal circuit of a system which includes the PLL circuit shown in FIG. 1 via the buffer amplifier 104 and directly fed to the prescaler 105 connected to the output terminal 103.

The prescaler 105 is connected to the phase comparator 107 through its output terminal 106. The prescaler 105 outputs a frequency-divided signal in accordance with the oscillating output to the phase comparator 107. The phase comparator 107 is supplied with both the frequency-divided signal from the prescaler 105 and a reference signal from the reference oscillator 108 constructed of, for example, a quartz oscillator. The phase comparator 107 detects a phase difference between the two input signals (the frequency-divided signal and the reference signal) to output a phase difference signal to the charge pump 109 on the basis of the detection.

The charge pump 109 is driven according to the phase difference signal from the phase comparator 107. The loop filter 110 connected to the output of the charge pump 109 may be implemented in various ways. The loop filter 110 includes at least a capacitor and a resistor. The filter 110 gives/receives electric charge to/from the charge pump 109. The voltage built up by the charge pump 109 is essential in the PLL circuit. That voltage serves as the oscillation control voltage dictating the frequency of the voltage-controlled oscillator 101. The loop filter 110 is constructed, for example, of a lowpass filter. The loop filter 110 smoothes, and removes noise from, the output from the charge pump 109 for an output (oscillation control voltage signal) to the voltage-controlled oscillator 101.

In the case of a high frequency PLL circuit, for example, the reference signal frequency is about a few MHz, and the oscillation signal frequency is about a few GHz. Like in this example, the oscillation signal frequency is typically about 1000 times the reference signal frequency. In the PLL circuit, the oscillating signal from the voltage-controlled oscillator 101 is frequency divided by the prescaler 105 before eliminating the phase difference between the frequency-divided signal and the reference signal from the reference oscillator 108.

The PLL circuit of the present embodiment, configured as above, includes a loop where the oscillation signal leaves the voltage-controlled oscillator 101 via the output terminal 103, goes through the prescaler 105, the phase comparator 107, the charge pump 109, and the loop filter 110, and comes back to the voltage-controlled oscillator 101. This feedback is repeated until there is no more phase difference between the frequency-divided signal from the prescaler 105 and the reference signal from the reference oscillator 108. Ultimately, the PLL circuit frequency becomes stable, when the PLL circuit comes to oscillate at a predetermined frequency.

The PLL circuit in FIG. 1 includes power consuming blocks: i.e. the voltage-controlled oscillator 101, the buffer amplifier 104, and the prescaler 105. These blocks consume especially large power in high speed PLL circuits with an oscillation frequency in excess of 3 to 5 GHz. Power supply to these blocks is turned off in a standby period when the PLL circuit is powered off.

The PLL circuit of the present embodiment includes the voltage value memory circuit 113 connected to an output section of the loop filter 110. The voltage value memory circuit 113 is provided to record a voltage value of the loop filter 110. The PLL circuit of the present embodiment also includes the comparator 114 of which the input section is connected to the loop filter 110 and the voltage value memory circuit 113. Specifically, the comparator 114 has a first input terminal 114A connected to the voltage value memory circuit 113 and a second input terminal 114B directly connected to the output of the loop filter 110.

The comparator 114 also has a first output 115 and a second output 116 both connected to the charge pump 109. If the voltage input at the second input terminal 114B is lower than the voltage input at the first input terminal 114A, the comparator 114 outputs a control signal from the first output 115. On the other hand, if the voltage input at the second input terminal 114B is higher than the voltage input at the first input terminal 114A, the comparator 114 outputs a control signal from the second output 116. The outputs from the first and second outputs 115, 116 are fed to the charge pump 109 as a comparison signal (current control signal).

If the power supply is on, and the PLL circuit is operating normally, the voltage value memory circuit 113 records the output voltage value from the loop filter 110 to the voltage-controlled oscillator 101 as part of that normal operation. When this is the case, the comparator 114 outputs no comparison signal to the charge pump 109. On the other hand, if the power supply is off, and the PLL circuit is not operating normally, the comparator 114 compares the value of the control voltage from the voltage value memory circuit 113 which appears at through the first input terminal 114A to the value of the output voltage from the loop filter 110 which appears at through the second input terminal 114B. The comparator 114 outputs a comparison signal controlling the charge pump 109 through either the first output 115 or the second output 116 so that the voltage of the loop filter 110 stays at the original value, that is, the value of the control voltage. The charge pump 109 supplies current to the loop filter 110 or draws current from the loop filter 110 on the basis of the comparison signal.

As described above, the PLL circuit of the present embodiment differs from conventional technology in that the charge pump and the loop filter are always in operation. In other words, in conventional PLL circuits, the charge pump and the loop filter switches between normal operation mode (ON) and standby mode (OFF) to determine the ON frequency of the voltage-controlled oscillator. In contrast, the PLL circuit of the present embodiment includes a voltage value memory circuit recording the value of the control voltage of the loop filter. Even in the standby mode (OFF), the comparator always compares the value of the output voltage of the loop filter and the value of the control voltage recorded in the voltage value memory circuit.

If there is a difference between these two voltage values, the comparator outputs a comparison signal to the charge pump on the basis of the difference. The charge pump then supplies/draws current to/from the loop filter in accordance with the output from the comparator.

As described above, the PLL circuit of the present embodiment has the charge pump in the PLL circuit always operating (throughout the ON period and the OFF period) so that the charge pump can function as a current supplier and/or drawer which regulates an OFF voltage value of the loop filter. Accordingly, the voltage of the loop filter can always be kept constant, which in turn stabilizes the ON voltage value (control voltage value). Therefore, when the whole PLL circuit is turned on next time, the PLL circuit oscillates immediately at an original frequency. The PLL circuit needs a reduced period of time before coming to oscillate in a stable manner (reduced pull-in time).

The PLL circuit of the present embodiment thus takes less time (shorter pull-in time, increased speed) than conventional art structures before coming to oscillate in a stable manner. Accordingly, the PLL circuit can operate for short periods of time only when necessary, cutting down on operational waste of the PLL circuit and lowering power consumption. Further, the PLL circuit of the present embodiment includes a charge pump in it as a current supplier/drawer to/from the loop filter; the circuit can be built in a simple structure.

Incidentally, the pull-in time resembles the lock-in time in that both of them refer to a time period from the switch on of the power supply to the stabilization of the oscillation frequency. More precisely, the pull-in time is the period until the PLL circuit comes to operate near a controllable frequency by virtue of a voltage-controlled oscillator. The lock-in time, which follows the pull-in time in which the frequency closes in to a value controllable by the PLL, is the period until the voltage-controlled oscillator comes to oscillate at a target frequency. As can be seen here, the pull-in time and the lock-in time are equivalent to rough regulation and fine regulation respectively in the oscillation control voltage regulation which brings the frequency to a target value.

The present invention may be arranged as the following PLL circuits.

A first PLL circuit including: a voltage-controlled oscillator capable of altering an oscillation frequency thereof according to a control voltage; a prescaler for frequency dividing an oscillation signal output from the voltage-controlled oscillator; a reference oscillator providing a reference frequency for the voltage-controlled oscillator; a phase comparator for detecting a phase difference between a frequency-divided signal from the prescaler and a signal from the reference oscillator; a charge pump for producing a current in accordance with an output of the phase comparator; and a loop filter constructed of a lowpass filter including a capacitor and a resistor, the lowpass filter smoothing the current output of the charge pump for output as a control voltage value to the voltage-controlled oscillator, the PLL circuit further including: a voltage value memory circuit for recording a voltage value of the loop filter; a comparator for comparing an output voltage of the loop filter to the voltage value recorded in the voltage value memory circuit; and a circuit for producing a current output control signal for the charge pump in accordance with an output value from the comparator, wherein: while the PLL circuit is powered off, the output voltage of the loop filter is compared to the voltage value recorded in the voltage value memory circuit; if the voltage of the loop filter increases or decreases from the voltage value recorded in the voltage value memory circuit, the charge pump draws or supplies current so that the output voltage of the loop filter is restored to an original voltage; and when powered on, the loop filter supplies the voltage-controlled oscillator with a voltage as immediately before a power off so as to shorten a pull-in time of the PLL circuit.

The first PLL circuit may be arranged so that: the voltage value memory circuit in the PLL circuit is constructed of a switch and a capacitor; the charge pump includes a current supply control circuit for supplying or drawing current according to the current output control signal from the comparator; the output voltage of the loop filter is recorded by means of electric charge stored in the capacitor; the output voltage value is stored by the capacitor by turning off the switch while the PLL circuit is powered off; the comparator compares the output voltage of the loop filter to the voltage value stored by the capacitor; if the voltage of the loop filter increases or decreases from the voltage value recorded in the voltage value memory circuit, the charge pump draws or supplies current so that the output voltage of the loop filter is restored to an original voltage; and when powered on, the loop filter supplies the voltage-controlled oscillator with a voltage as immediately before a power off so as to shorten a pull-in time of the PLL circuit.

The first PLL circuit may be arranged so that: the voltage value memory circuit is constructed of an A/D converter, a D/A converter, and a memory; the charge pump includes a current supply on/off circuit for supplying or drawing current according to the current output control signal from the comparator; a voltage value is recorded by storing, in the memory, information converted to digital from the output voltage of the loop filter by the A/D converter; the D/A converter converts the information stored in the memory to voltage while the PLL circuit is powered off; the comparator compares the voltage to the output voltage of the loop filter; if the voltage of the loop filter increases or decreases from the voltage value recorded in the voltage value memory circuit, the charge pump draws or supplies current so that the output voltage of the loop filter is restored to an original voltage; and when powered on, the loop filter supplies the voltage-controlled oscillator with a voltage as immediately before a power off so as to shorten a pull-in time of the PLL circuit.

The first PLL circuit may be such that a common current control signal for the charge pump is shared by coupling a current control signal from the comparator and a current control signal from the phase comparator to a multiplexer, to combine current control circuits for the charge pump and realize functions of the first PLL circuit without modifying an ordinary charge pump circuit.

Now, the present invention will be described further in detail by way of examples. The present invention is however by no means limited by the examples. the members of the examples that have the same arrangement and function as those of the embodiment, and that are mentioned in that embodiment are indicated by the same reference numerals and description thereof is omitted.

EXAMPLE 1

Figure 2:
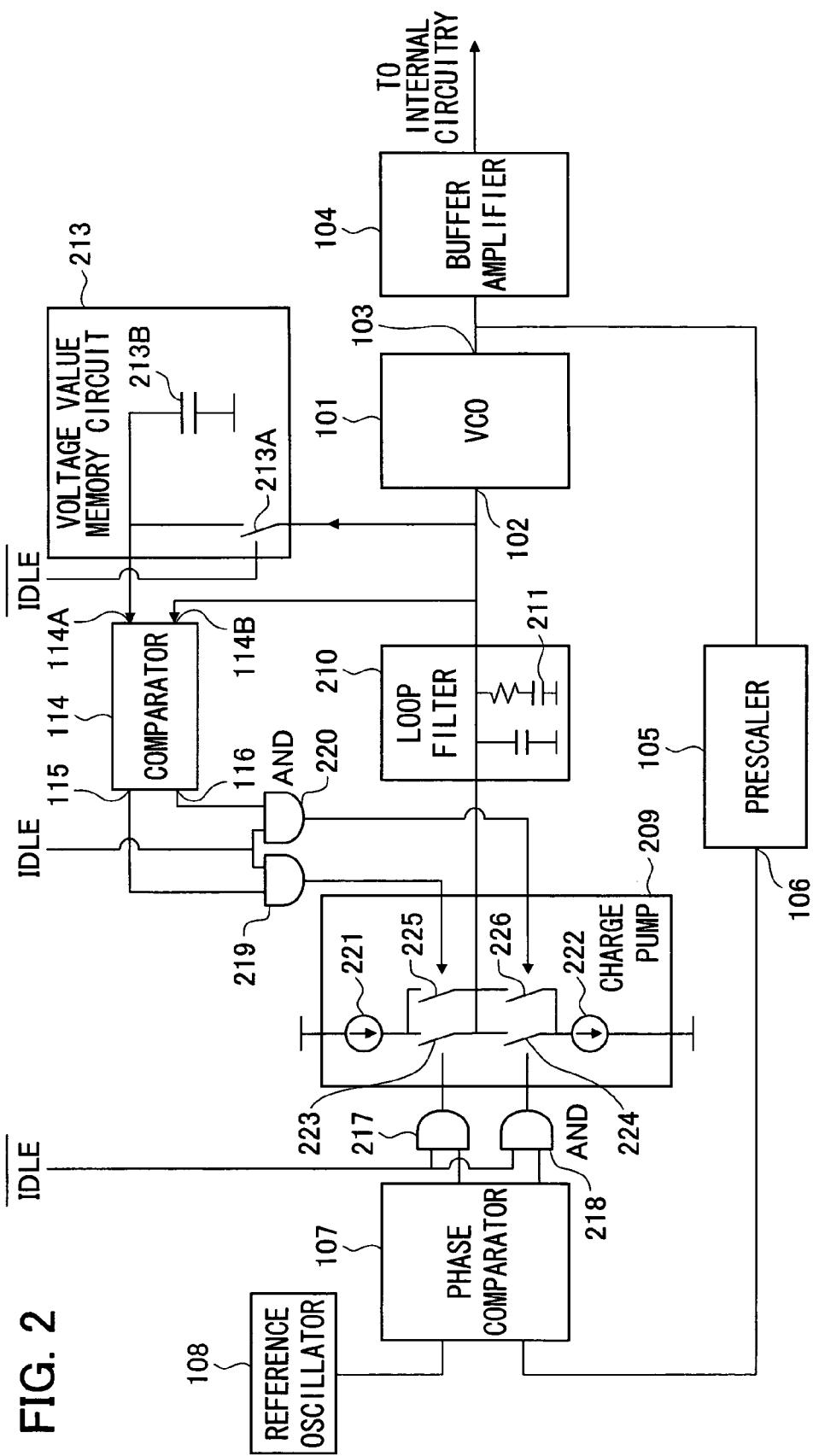
FIG. 2 is a block diagram illustrating the structure of a PLL circuit which represents example 1 of the present invention.

FIG. 2 is a block diagram illustrating the structure of a PLL circuit which represents example 1 of the present invention. As shown in the figure, The PLL circuit of the present example includes a circuit containing a switch 213A and a capacitor 213B as the voltage value memory circuit 213. The capacitor 213B is located at a position equivalent to that of the capacitor 211 in the loop filter 210. The capacitor 213B is therefore a part of the loop filter 210 while the PLL is in operation.

Whether the phase difference signal or the comparison signal is fed to the charge pump 209 is controlled in accordance with whether the PLL circuit is in a normal operation mode (ON) or in a standby mode (OFF). Thus there are provided AND circuits 217, 218, 219, 220 to the phase difference signal output of the phase comparator 107 and the comparison signal output of the comparator 114. In addition, in the PLL circuit of the present example the charge pump 209 is constructed of: a source power supply, or current supplier, 221; a sink power supply, or current drawer, 222; switches 223, 224 which turn on/off with a signal from the phase comparator 107; and switches 225, 226 which turn on/off with a signal from the comparator 114. Normally, these switches 223 to 226 are turned off, placing the charge pump 209 at high output impedance. Almost no current leak occurs through the charge pump 209.

First will be described a case where the power supply is turned on and the PLL circuit in example 1 is in normal operation. Assume that the PLL circuit is in "normal operation mode" and that IDLE=L in FIG. 2. Under these conditions, the switch 213A in the voltage value memory circuit 213 is on, charging the capacitor 213B up to the same voltage as the output voltage (control voltage value) of the loop filter 210. The AND circuits 219, 220 connected to the outputs of the comparator 114 output LOW signals, allowing the phase difference signal output of the phase comparator 107 to be coupled to the control switches 223, 224 in the charge pump 209. When this is the case, the PLL circuit of the present example operates normally.

Next will be described a case where the power supply is turned off, switching the PLL circuit of example 1 into a standby mode. Assume that the PLL circuit is in "standby mode" and that IDLE=H in FIG. 2. Under these conditions, the switch 213A in the voltage value memory circuit 213 is off, enabling the capacitor 213B to retain the output voltage (control voltage value) of the loop filter 210 when it was in operation. In addition, the AND circuits 217, 218 connected to the outputs of the phase comparator 107 output LOW signals, allowing the comparison signal output of the comparator 114 to be coupled to the control switches 225, 226 in the charge pump 209.

If the output voltage of the loop filter 210 falls below the electric potential (control voltage value) of the capacitor 213B in the voltage value memory circuit 213, the switch 225 in the charge pump 209 is turned on by the comparator 114 outputting a control signal (comparison signal) through the first output 115. The charge pump 209 supplies current to the loop filter 210 to eliminate the difference between the two input voltages to the comparator 114. Conversely, if the output voltage of the loop filter 210 rises in excess of the electric potential of the capacitor 213B, the switch 226 in the charge pump 209 is turned on by the comparator 114 outputting a control signal (comparison signal) through the second output 116. The charge pump 209 draws current from the loop filter 210 to eliminate the difference between the two input voltages to the comparator 114.

These actions maintain a constant voltage of the loop filter 210 when the PLL is turned off. When the PLL is turned on again, the oscillation frequency of the voltage-controlled oscillator 101 can be restored immediately to the value before the PLL is turned off, shortening the pull-in time of the PLL.

EXAMPLE 2

Figure 3:
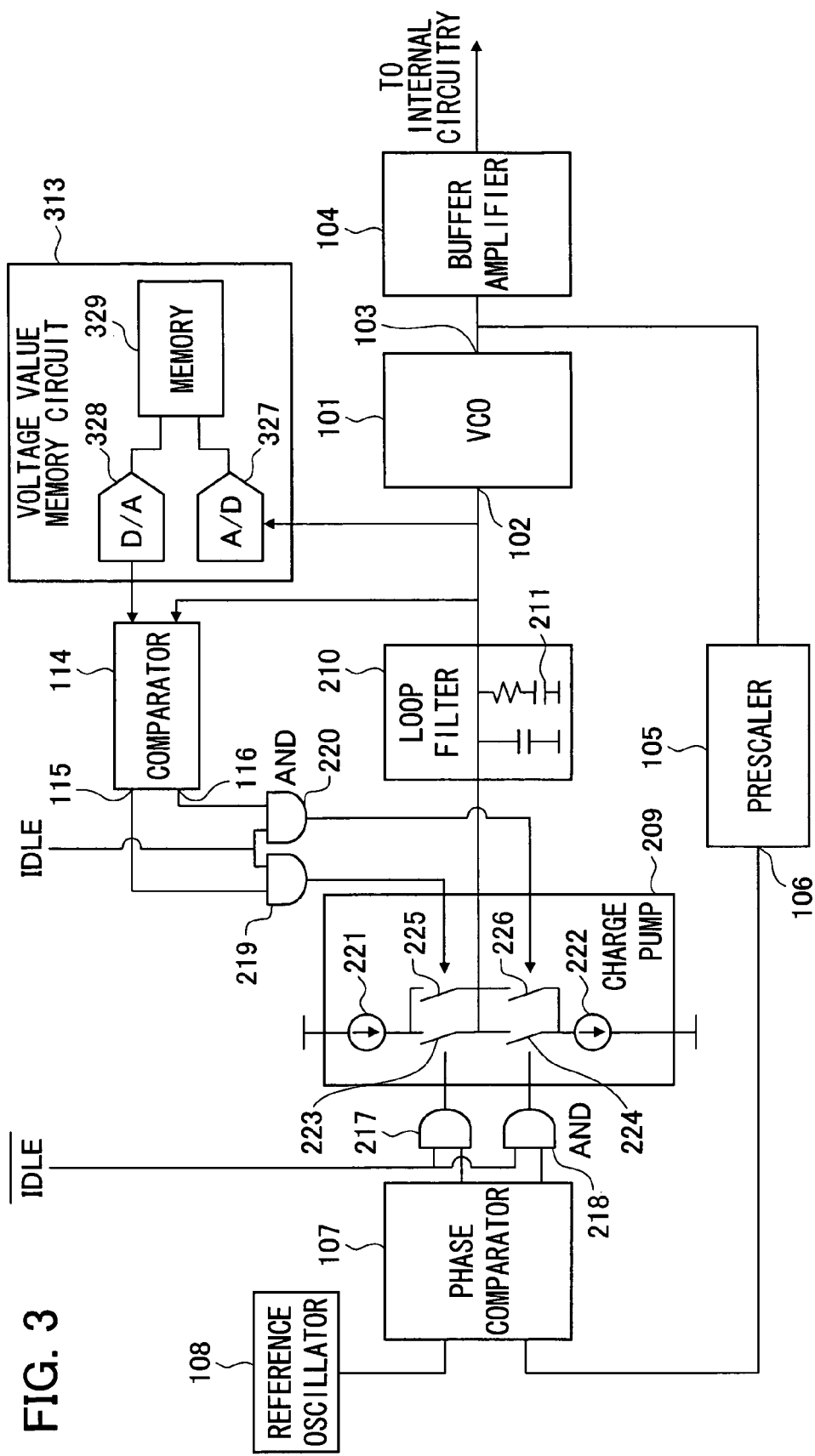
FIG. 3 is a block diagram illustrating the structure of a PLL circuit which represents example 2 of the present invention.

FIG. 3 is a block diagram illustrating the structure of a PLL circuit which represents example 2 of the present invention. As shown in the figure, the present example differs from example 1 above in the voltage value memory circuit 313; otherwise, example 2 has the same structure as example 1.

The voltage value memory circuit 313 of the present example includes an A/D converter 327, a D/A converter 328, and a memory 329. The A/D converter 327 is connected to the loop filter 210 and the memory 329. The A/D converter 327 converts an analog signal input of the loop filter 210 to digital for an output to the memory 329 where the output is recorded. The D/A converter 328 is connected to the memory 329 and the comparator 114. The D/A converter 328 converts a digital signal stored in the memory 329 to an analog signal for an output to the comparator 114.

The voltage value memory circuit 313 operates in the same fashion as the voltage value memory circuit 113 (see FIG. 1) as far as the embodiment is concerned. The voltage value memory circuit 313 of the present example has an advantage over that in example 1 that it can maintain the detected voltage value of the loop filter 210 more accurately and for an extended time.

In addition, it would be sufficient if both the A/D converter 327 and the D/A converter 328 in the voltage value memory circuit 313 are of 8 bits. The converters are not required to operate at high speed. The circuit size of the voltage value memory circuit 313 is therefore not large. In addition, the voltage value memory circuit 313 can be built using a circuit which consumes as little as a few milliwatts. The use of the voltage value memory circuit 313 dose not add to the overall chip size and power consumption of the PLL circuit.

EXAMPLE 3

Figure 4:
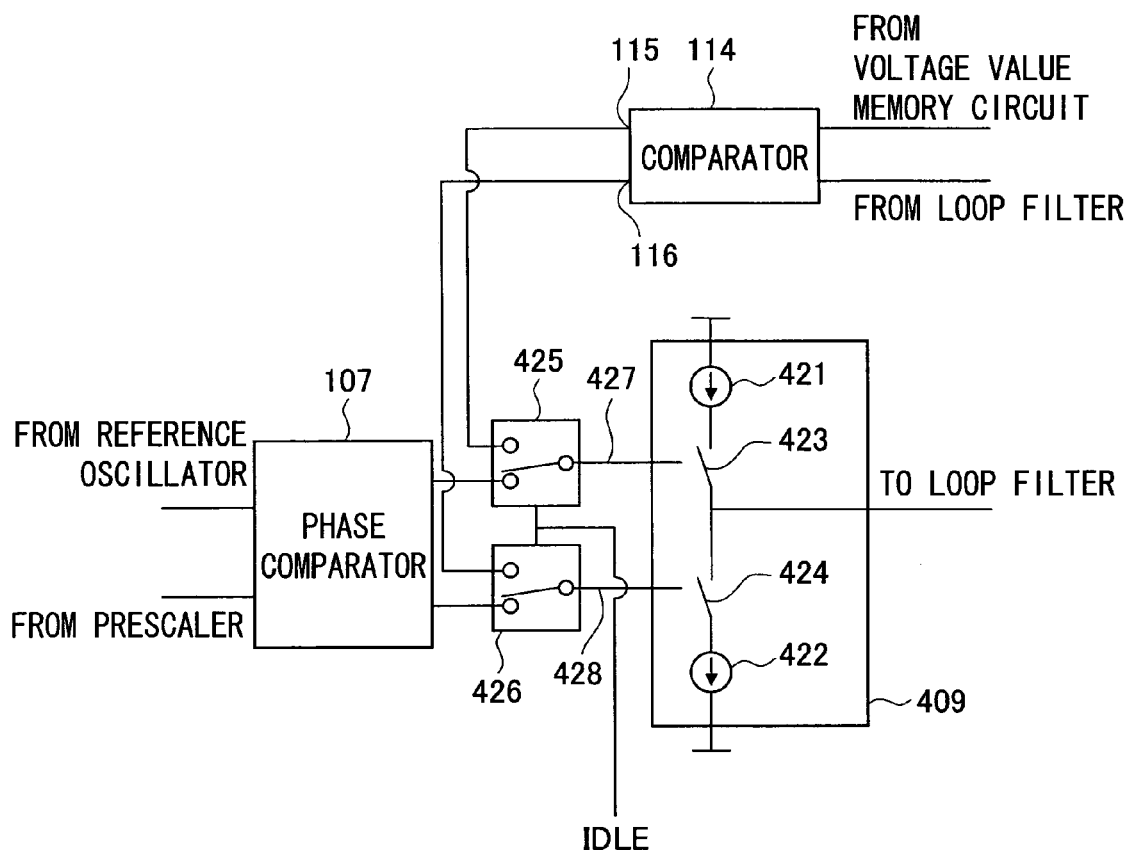
FIG. 4 is a block diagram illustrating the structure in and around a charge pump of a PLL circuit which represents example 3 of the present invention.
Figure 5:
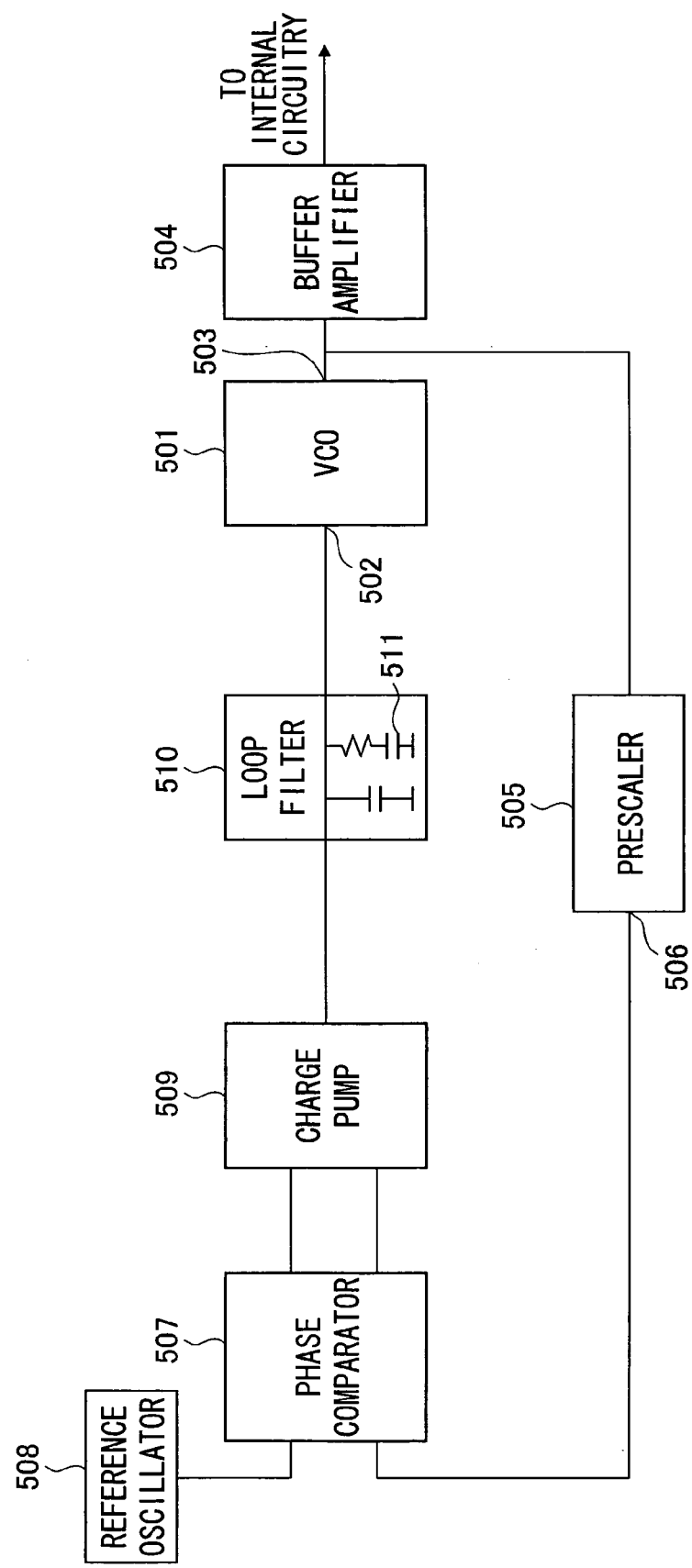
FIG. 5 is a block diagram illustrating a basic structure of a conventional PLL circuit.
Figure 6:
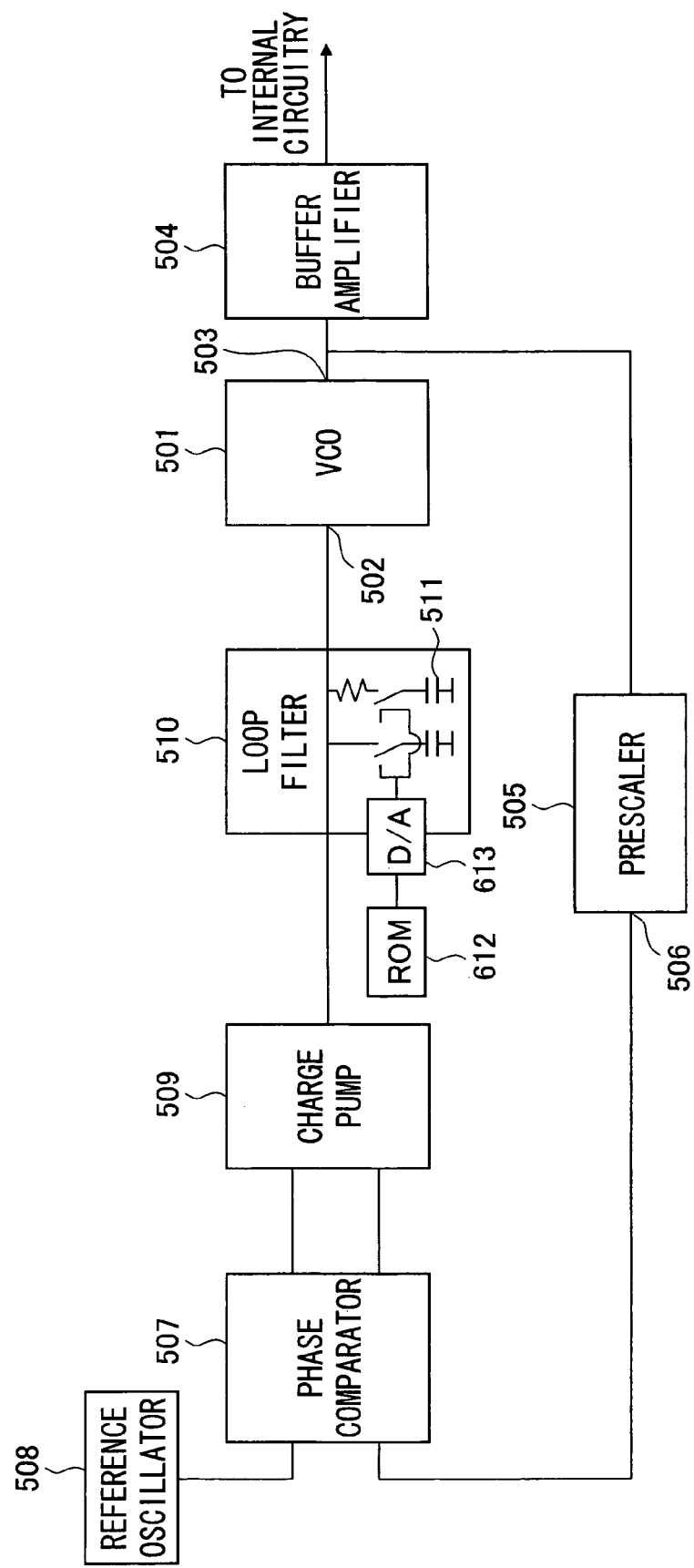
FIG. 6 is a block diagram illustrating the structure of a PLL circuit which represents a first conventional art example.
Figure 7:
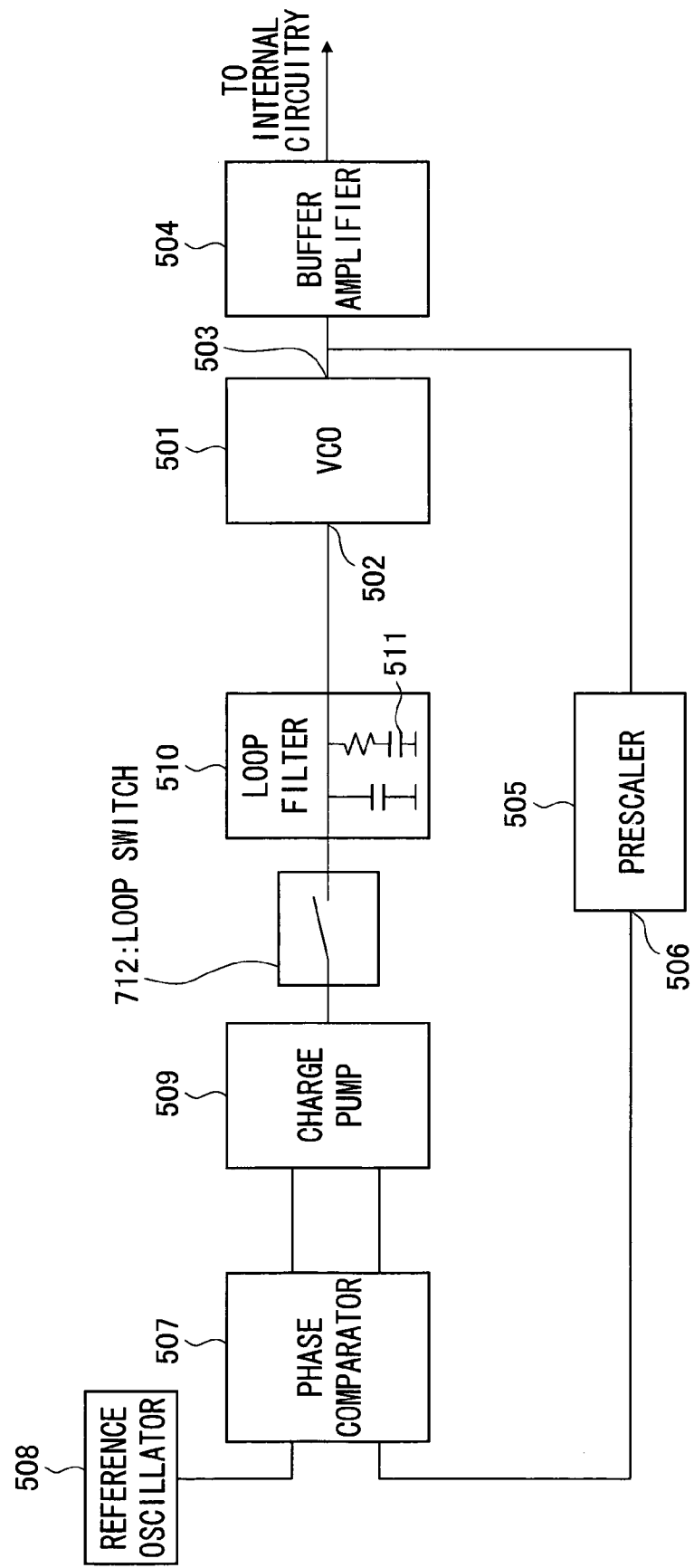
FIG. 7 is a block diagram illustrating the structure of a PLL circuit which represents a second conventional art example.
Figure 8:
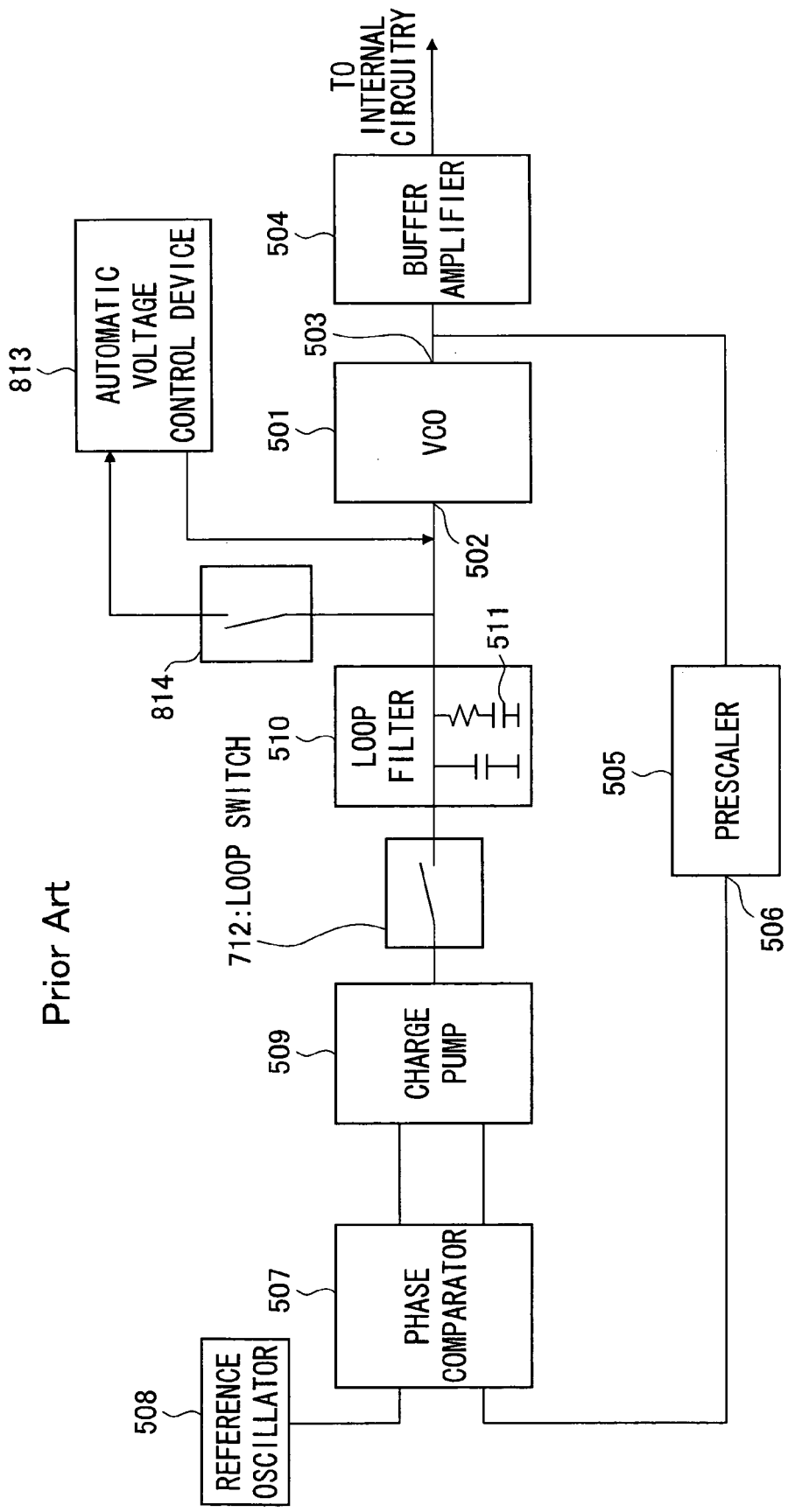
FIG. 8 is a block diagram illustrating the structure of a PLL circuit which represents a third conventional art example.
Figure 9:
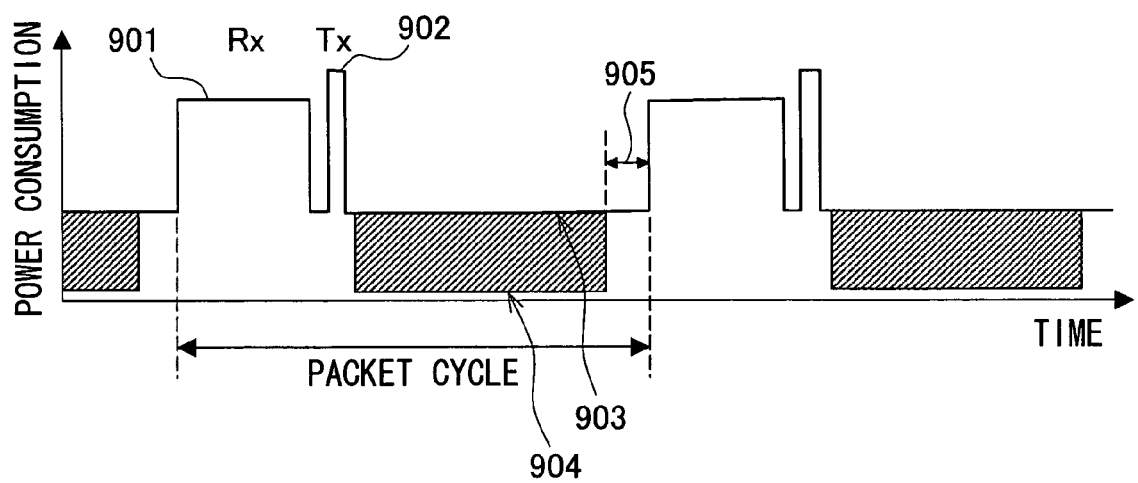
FIG. 9 shows how power consumption in a transceiver block of a wireless LAN system changes with time when receiving a data packet.

FIG. 4 is a block diagram illustrating the structure in and around a charge pump of a PLL circuit which represents example 3 of the present invention. As shown in the figure, in the present example, the output signals of the phase comparator and the comparator are coupled using a multiplexer, which reduces the number of current control switches for the charge pump as compared to examples 1, 2. The PLL circuit of the present example differs from those of examples 1, 2 in that the charge pump has less internal current control switches than in examples 1, 2 and that the output signals of the phase comparator and the comparator are coupled using a multiplexer; otherwise, the present example has the same structure as examples 1, 2.

The charge pump 409 in the PLL circuit of the present example is constructed of a source power supply, or current supplier, 421; a sink power supply, or current drawer, 422; and switches 423, 424 which are turned on/off by a signal from either the phase comparator 107 or the comparator 114. One of the two outputs of the phase comparator 107 and one of the two outputs of the comparator 114 are coupled to the inputs of the multiplexer 425; the other output of the phase comparator 107 and the other output of the comparator 114 are coupled to the inputs of the multiplexer 426. The output terminals 427, 428 of the multiplexers 425, 426 are connected the switches 423, 424 of the charge pump 409 respectively.

The PLL circuit of the present example is adapted so that the switches of the multiplexers 425, 426 switch to the phase comparator 107 in "normal operation mode" with IDLE=L in FIG. 4 and to the comparator 114 in "standby mode" with IDLE=H. Accordingly, the charge pump 409 of the present example has only two switches as compared to four in the case of the charge pump 209 of examples 1, 2 (see FIGS. 2, 3).

In the PLL of the present example, this circuit structure inside the charge pump, although simplified, maintains a voltage of the loop filter. The structure is able to reduce irregularities between operation modes for output current of the charge pump.

The PLL circuit of the present embodiment preferably further includes: a voltage value memory circuit for recording a control voltage value of the loop filter; and a comparator for comparing the control voltage value to an output voltage value from the loop filter while the voltage-controlled oscillator is not oscillating, to output a comparison signal, wherein the charge pump controls the voltage of the loop filter according to the comparison signal output from the comparator while the voltage-controlled oscillator is not oscillating.

According to the structure, the charge pump controls the voltage of the loop filter according to a comparison between the output voltage of the loop filter and the control voltage value of the voltage value memory circuit while the voltage-controlled oscillator is not oscillating. The PLL circuit thus achieves increased speed and reduced power consumption without adding complexity to the structure of the PLL circuit.

When the PLL circuit is structured as above, if there is a difference between the output voltage value and the control voltage value, the charge pump only needs to either supply current to the loop filter or draw current from the loop filter so that the output voltage value of the loop filter approaches the control voltage value. Accordingly, the voltage value of the loop filter (output voltage value) approaches the control voltage value with the control of the loop filter involving the charge pump. In addition, when this is the case, the voltage of the loop filter is maintained at the control voltage value even when the PLL circuit is powered off (i.e., the voltage-controlled oscillator is not oscillating). Thus, the loop filter, when the PLL circuit is powered on, supplies the voltage-controlled oscillator with a voltage of the loop filter in a power off state immediately before the PLL circuit is powered on, so as to shorten the pull-in time of the PLL circuit.

An example of the control voltage value is the voltage value obtained by the voltage value memory circuit from the loop filter while the voltage-controlled oscillator is oscillating at a predetermined frequency.

In addition, in the PLL circuit of the present embodiment, the comparator is preferably arranged to have two output terminals and output the comparison signal from different one of the output terminals depending on whether the output voltage value from the loop filter is greater or less than the control voltage value.

In addition, in the PLL circuit of the present embodiment, the voltage value memory circuit preferably has a switch and a capacitor, the switch being provided between an output of the loop filter and the capacitor, and while the voltage-controlled oscillator is oscillating at a predetermined frequency, the switch is turned on so that the capacitor records the control voltage value by means of electric charge stored therein and turned off so that the capacitor holds the control voltage value.

Accordingly, when the PLL circuit is on, and the voltage-controlled oscillator is oscillating at a predetermined frequency, the output voltage value (control voltage value) of the loop filter is stored in the capacitor in the voltage value memory circuit by turning on the switch. In addition, by turning off the switch, the capacitor holds the stored control voltage value. If the loop filter is constructed of a lowpass filter including a capacitor, for example, the capacitor in the loop filter only needs to be placed at an equivalent position to the capacitor in the voltage value memory circuit.

In the PLL circuit of the present embodiment, preferably, the voltage value memory circuit has an A/D converter, a D/A converter, and a memory; the memory records information obtained by converting, to digital by the A/D converter, the control voltage value of the loop filter while the voltage-controlled oscillator is oscillating at a predetermined frequency; and the information recorded in the memory is converted to the control voltage value by the D/A converter for output to the comparator while the voltage-controlled oscillator is not oscillating.

According to the arrangement, the output voltage value (control voltage value) of the loop filter while the voltage-controlled oscillator is oscillating at a predetermined frequency can be accurately stored in the memory as converted digital information for an extended period of time. Accordingly, the comparison signal from the comparator is rendered accurate. Thus the charge pump controls the voltage of the loop filter more precisely.

The PLL circuit of the present embodiment preferably further includes a multiplexer for selectively outputting, to the charge pump, either the comparison signal from the comparator or the phase difference signal from the phase comparator.

According to the arrangement, the multiplexer selectively outputs, to the charge pump, either the comparison signal from the comparator or the phase difference signal from the phase comparator. Therefore, the charge pump contains a fewer switches than when the comparison signal and the phase difference signal are separately output directly to the charge pump. The structure of the charge pump can be simplified.

In the PLL circuit of the present embodiment, preferably, the voltage value memory circuit includes a switch and a second capacitor; and the charge pump includes a current supply control circuit provided to charge or discharge the first capacitor in the loop filter in accordance with the current output control signal.

According to the arrangement, the output voltage value of the loop filter is recorded by means of the electric charge stored in the first capacitor. The output voltage value is stored by the first capacitor by turning off the switch while the PLL circuit is powered off. The comparator compares the output voltage of the loop filter to the voltage value stored by the first capacitor. If the voltage of the loop filter increases or decreases from the voltage value recorded in the voltage value memory circuit, the charge pump draws/supplies current from/to the first capacitor so that the output voltage of the loop filter is restored to the voltage. Therefore, when powered on, the loop filter supplies the voltage-controlled oscillator with a voltage as immediately before the power off so as to shorten the pull-in time of the PLL circuit.

In the PLL circuit of the present embodiment, preferably, the voltage value memory circuit includes an A/D converter, a D/A converter, and a memory; and the charge pump includes a current supply control circuit provided to charge or discharge the first capacitor in the loop filter in accordance with the current output control signal.

According to the arrangement, a voltage value is recorded by storing, in the memory, information converted to digital from the output voltage of the loop filter by the A/D converter. The D/A converter converts the information stored in the memory to voltage while the PLL circuit is powered off. The comparator compares the voltage to the output voltage of the loop filter. If the voltage of the loop filter increases or decreases from the voltage value recorded in the voltage value memory circuit, the charge pump draws/supplies current from/to the first capacitor so that the output voltage of the loop filter is restored to the original voltage. Therefore, when powered on, the loop filter supplies the voltage-controlled oscillator with a voltage as immediately before the power off so as to shorten the pull-in time of the PLL circuit.

The PLL circuit of the present embodiment preferably further includes a multiplexer for selectively supplying either the comparison signal from the comparator or the phase difference signal from the phase comparator to the charge pump.

According to the arrangement, a common current control signal for the charge pump is shared to combine current control circuits for the charge pump and realize the functions of the PLL circuit without modifying an ordinary charge pump circuit.

The PLL circuit of the present invention is applicable to oscillator sections in mobile phones and wireless LAN apparatus to produce high frequency. The PLL circuit is especially useful to achieve increased speed and reduced power consumption in these systems which are repeatedly and frequently turned on/off.

The embodiments and examples described above in the Description of the Embodiments are for illustrative purposes only and by no means limit the scope of the present invention. Variations are not to be regarded as a departure from the spirit and scope of the invention, and all such modifications as would be obvious to one skilled in the art are intended to be included within the scope of the claims below.

What is claimed is:

1. A PLL circuit, comprising:
   a voltage-controlled oscillator for altering an oscillation frequency according to an oscillation control voltage signal;
   a prescaler for dividing the oscillation frequency provided by the voltage-controlled oscillator to output a frequency-divided signal;
   a reference signal oscillator for producing an oscillating reference signal;
   a phase comparator for detecting a phase difference between the frequency-divided signal and the reference signal to output a phase difference signal based on the detection;
   a charge pump for outputting current in accordance with the phase difference signal from the phase comparator;
   a loop filter for smoothing the output current of the charge pump for output as the oscillation control voltage signal to the voltage-controlled oscillator,
   wherein the charge pump controls a voltage of the loop filter while the voltage-controlled oscillator is not oscillating;

a voltage value memory circuit for recording a control voltage value of the loop filter;
a comparator for comparing the control voltage value to an output voltage value from the loop filter while the voltage-controlled oscillator is not oscillating, to output a comparison signal,
wherein the charge pump controls the voltage of the loop filter according to the comparison signal from the comparator while the voltage-controlled oscillator is not oscillating; and
a multiplexer for selectively outputting, to the charge pump, either the comparison signal from the comparator or the phase difference signal from the phase comparator.

2. The PLL circuit of claim 1, wherein if there is a difference between the output voltage value and the control voltage value, the charge pump either supplies current to the loop filter or draws current from the loop filter, to bring the output voltage value from the loop filter close to the control voltage value.

3. The PLL circuit of claim 2, wherein when the PLL circuit is powered on, the loop filter supplies the voltage-controlled oscillator with the voltage of the loop filter immediately before the PLL circuit is powered on.

4. The PLL circuit of claim 1, wherein the control voltage value is a voltage value obtained from the loop filter by the voltage value memory circuit while the voltage-controlled oscillator is oscillating at a predetermined frequency.

5. The PLL circuit of claim 1, wherein the comparator has two output terminals and outputs the comparison signal from different one of the output terminals depending on whether the output voltage value from the loop filter is greater or less than the control voltage value.

6. A PLL circuit, comprising:
a voltage-controlled oscillator for altering an oscillation frequency according to an oscillation control voltage signal;
a prescaler for dividing the oscillation frequency provided by the voltage-controlled oscillator to output a frequency-divided signal;
a reference signal oscillator for producing an oscillating reference signal;
a phase comparator for detecting a phase difference between the frequency-divided signal and the reference signal to output a phase difference signal based on the detection;
a charge pump for outputting current in accordance with the phase difference signal from the phase comparator;
a loop filter for smoothing the output current of the charge pump for output as the oscillation control voltage signal to the voltage-controlled oscillator,
wherein the charge pump controls a voltage of the loop filter while the voltage-controlled oscillator is not oscillating;
a voltage value memory circuit for recording a control voltage value of the loop filter;
a comparator for comparing the control voltage value to an output voltage value from the loop filter while the voltage-controlled oscillator is not oscillating, to output a comparison signal,
wherein the charge pump controls the voltage of the loop filter according to the comparison signal from the comparator while the voltage-controlled oscillator is not oscillating;
the voltage value memory circuit has a switch and a capacitor, the switch being provided between an output of the loop filter and the capacitor; and
while the voltage-controlled oscillator is oscillating at a predetermined frequency, the switch is turned on so that the capacitor records the control voltage value by means of electric charge stored therein and turned off so that the capacitor holds the control voltage value.

7. A PLL circuit, comprising:
a voltage-controlled oscillator for altering an oscillation frequency according to an oscillation control voltage signal;
a prescaler for dividing the oscillation frequency provided by the voltage-controlled oscillator to output a frequency-divided signal;
a reference signal oscillator for producing an oscillating reference signal;
a phase comparator for detecting a phase difference between the frequency-divided signal and the reference signal to output a phase difference signal based on the detection;
a charge pump for outputting current in accordance with the phase difference signal from the phase comparator;
a loop filter for smoothing the output current of the charge pump for output as the oscillation control voltage signal to the voltage-controlled oscillator,
wherein the charge pump controls a voltage of the loop filter while the voltage-control oscillator is not oscillating;
a voltage value memory circuit for recording a control voltage value of the loop filter;
a comparator for comparing the control voltage value to an output voltage value from the loop filter while the voltage-controlled oscillator is not oscillating, to output a comparison signal,
wherein the charge pumps controls the voltage of the loop filter according to the comparison signal from the comparator while the voltage-controlled oscillator is not oscillating;
the voltage value memory circuit has an A/D converter, a D/A converter, and a memory;
the memory records information obtained by converting, to digital by the A/D converter, the control voltage value of the loop filter while the voltage-controlled oscillator is oscillating at a predetermined frequency; and
the information recorded in the memory is converted to the control voltage value by the D/A converter for output to the comparator while the voltage-controlled oscillator is not oscillating.

8. A PLL circuit, comprising:
a voltage-controlled oscillator capable of altering an oscillation frequency thereof according to a control voltage value;
a prescaler for frequency dividing an oscillation signal output from the voltage-controlled oscillator;
a reference oscillator providing a reference frequency for the voltage-controlled oscillator;
a phase comparator for detecting a phase difference between a frequency-divided signal from the prescaler and a signal from the reference oscillator to output a phase difference signal;
a charge pump for producing a current in accordance with the phase difference signal from the phase comparator;
a loop filter constructed of a lowpass filter including a first capacitor and a resistor, the lowpass filter smoothing the current output of the charge pump for output as the control voltage value to the voltage-controlled oscillator;
a voltage value memory circuit for recording a voltage value of the loop filter;

a comparator for comparing an output voltage of the loop filter to the voltage value recorded in the voltage value memory circuit so as to output a comparison signal if the voltage control oscillator is not oscillating;

a circuit for producing a current output control signal for the charge pump in accordance with the comparison signal from the comparator; and a multiplexer for selectively supplying either the comparison signal from the comparator or the phase difference signal from the phase comparator to the charge pump.

9. The PLL circuit of claim 8, wherein:

the voltage value memory circuit includes a switch and a second capacitor; and the charge pump includes a current supply control circuit provided to charge or discharge the first capacitor in the loop filter in accordance with the current output control signal.

10. The PLL circuit of claim 8, wherein:

the voltage value memory circuit includes an A/D converter, a D/A converter, and a memory; and the charge pump includes a current supply control circuit provided to charge or discharge the first capacitor in the loop filter in accordance with the current output control signal.

* * * * *